United States Patent [19]
Davis

[11] 4,064,493
[45] Dec. 20, 1977

[54] P-ROM CELL HAVING A LOW CURRENT FUSIBLE PROGRAMMING LINK

[75] Inventor: Walter Lee Davis, Plantation, Fla.
[73] Assignee: Motorola, Inc., Schaumburg, Ill.
[21] Appl. No.: 692,699
[22] Filed: June 3, 1976
[51] Int. Cl.² .................. G11C 11/40; G11C 17/00
[52] U.S. Cl. ................................. 365/96; 365/104
[58] Field of Search ..................... 340/173 SP, 173 R

[56] References Cited
U.S. PATENT DOCUMENTS

| | | | |
|---|---|---|---|
| 3,529,299 | 9/1970 | Chung et al. | 340/173 SP |
| 3,848,238 | 11/1974 | Rizzi et al. | 340/173 SP |
| 3,971,058 | 7/1976 | Fagan et al. | 340/173 SP |

Primary Examiner—Terrell W. Fears
Attorney, Agent, or Firm—Margaret M. Parker; James W. Gillman

[57] ABSTRACT

A programmable cell for a P-ROM (programmable read only memory) matrix includes a bipolar transistor having a fusible link in one of the transistor leads on the substrate. The fusible link is a "necked-down" portion of one of the leads, positioned adjacent the base-collector junction where it is heated by the junction current, causing the links to open at a low fusing current.

6 Claims, 6 Drawing Figures

P-ROM CELL HAVING A LOW CURRENT FUSIBLE PROGRAMMING LINK

BACKGROUND OF THE INVENTION

This invention relates to the field of P-ROM arrays or matrices and more particularly to a low current fusible link for programming a selected cell in such an array.

Programmable read only memories (P-ROM) are devices which can only be "written on" or "programmed" once, but can be "read" any number of times and are well known in the art. The programming process is not reversible. Early art includes magnetic cores and capacitors, both of which were expensive and slow to program. Solid state (IC) devices were developed which solved these problems to some extent, the earliest ones being programmed during the manufacturing process, which required a different diffusion mask for each program desired. The next improvement came in designing the cells on the IC chip with an element which could be selectively destroyed as desired after manufacture. In some such devices the element to be destroyed was shorted out, and in some it was opened. Resistive elements, back-to-back diodes, transistor/diode combinations, SCR/fuse combinations, Zener diodes and transistor/nichrome fuse combinations have all been used, but all require relatively large currents for programming. Frequently this large current destroyed cells not intended to be destroyed, or shorted out an element instead of opening it. Various features were designed into the devices to control the programming currents but these features required either extra processing steps or more space on the chip and thus added to the cost of the device.

SUMMARY OF THE INVENTION

It is therefore an object of the present invention to provide a fusible link cell for a P-ROM array which can be programmed with a relatively low current.

It is also an object to provide such a cell which does not require extra production steps or excessive space on the chip.

A programmable cell constructed according to the invention includes a transistor formed on a substrate according to techniques well known in solid state art. The aluminum metalization which forms the emitter-to-ground lead includes a narrow portion or fusible link which is positioned adjacent the base-collector junction. When programming current flows through the junction, the narrow lead portion is heated by the junction so that less current is required to open the fuse. The action of this fuse is slower than most prior art devices, but the lowered power requirement is more important than the programming time in certain applications. A typical application would be a code plug for a miniature paging receiver where the code plug provides the "address" or signal sequence to which the paging receiver will respond.

DETAILED DESCRIPTION OF THE PREFERRED EMBODIMENTS

Figure 1A:
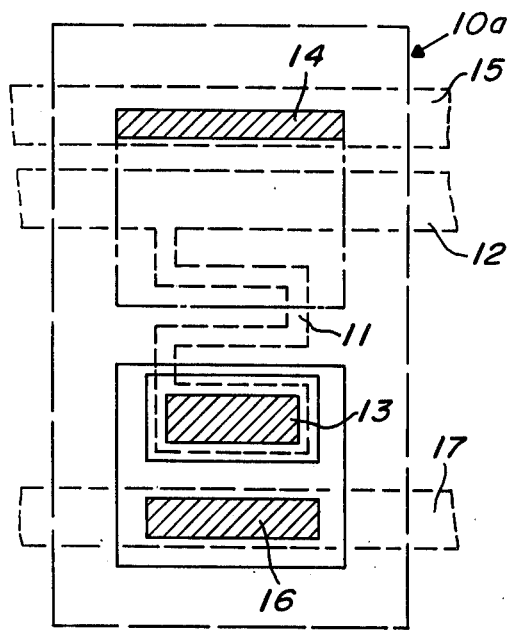
FIGS. 1a, 1b and 1c are a plan view, a schematic diagram and a cut away perspective view respectively of a programmable cell having a fusible link in the transistor emitter lead.
Figure 1B:
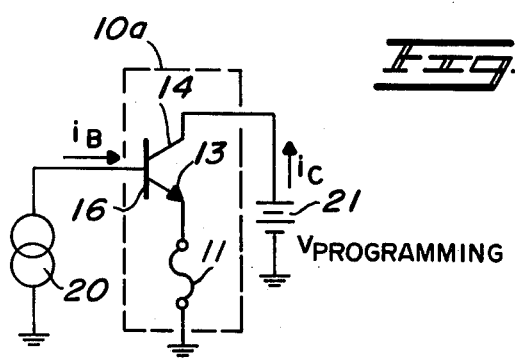
Figure 1C:
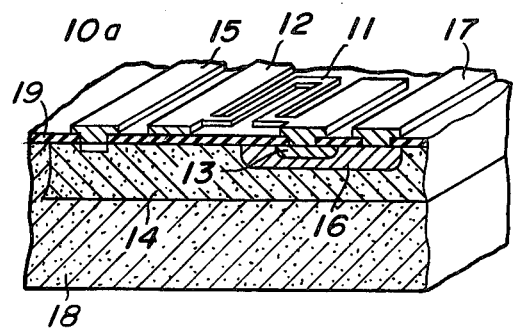

The invention is best understood in relation to the drawing in which like parts have like reference numerals throughout. FIGS. 1a, 1b and 1c disclose a cell 10a which is formed as part of an integrated circuit chip (not shown in its entirety), and has a fusible link in the emitter lead 12 of a transistor having an emitter 13, a collector 14, collector lead 15, a base 16 and a base lead 17. A portion of the substrate 18 and the SiO$_2$ layer 19 are also shown in FIG. 1c. A current source 20 (FIG. 1b) is connected to the base lead 17 and a programming voltage source 21 is connected to the collector lead 15. As current flows in the transistor, the collector-base junction region heats up, warming the narrowed, fusible link portion 11 of the emitter lead 12 which is positioned immediately above the collector-base junction. Current flow in the transistor and link then fuses the link, opening the emitter lead 12 of the cell 10a on the IC chip. Since the electro-migration phenomena which causes the link 11 to open is exponentially dependent on temperature, a much lower current is required to open the heated link than would be the case if the link were unheated. In practice, a heated link may require an order of magnitude less current than an unheated link. Since the link is formed at the same time and of the same material as the other lead portions, (an aluminum deposition preferably) no additional or more expensive manufacturing step is required. The fusing (or programming) current $i_c$ is supplied from the programming voltage source 21.

Figure 2A:
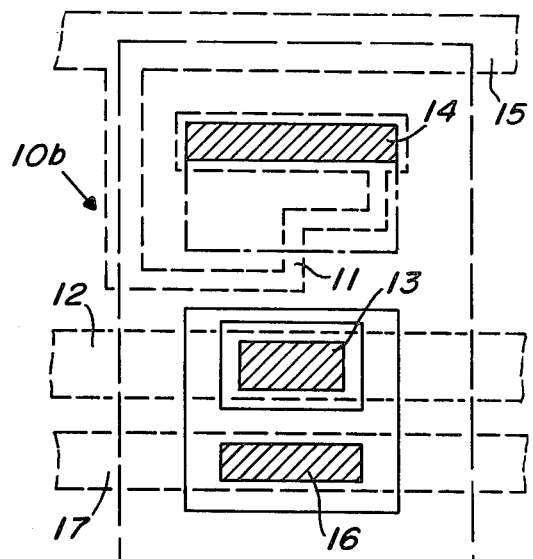
FIGS. 2a and 2b are a plan view and schematic diagram of a second embodiment having a fusible link in the transistor collector lead.
Figure 2B:
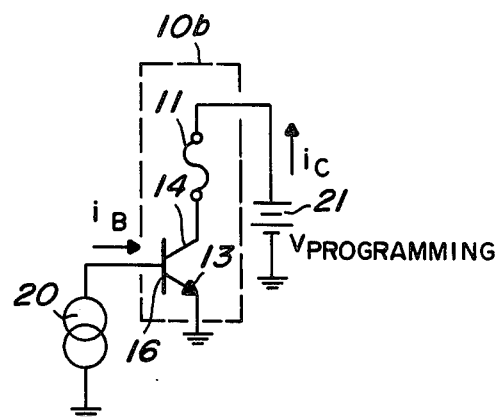

FIGS. 2a and 2b disclose another embodiment 10b wherein thermal energy is again supplied by the collector-base junction of a transistor to a fusible link 11 positioned above the junction on an integrated circuit chip. In this embodiment, however, the link 11 is formed in the collector lead 15 and opens the collector circuit when it is fused or programmed.

Figure 3:
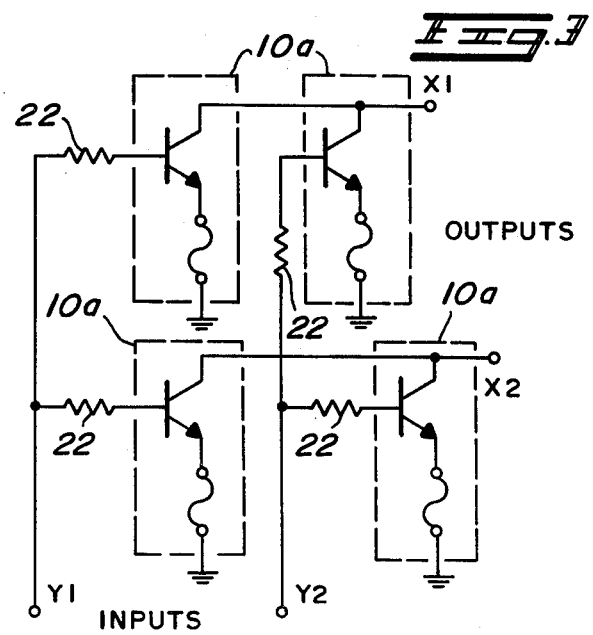
FIG. 3 is a schematic of an array of cells such as those of FIG. 1.

FIG. 3 is a P-ROM consisting of four cells such as cell 10a with X1, X2, Y1 and Y2 terminals. To program a desired pattern, the links to be opened are addressed in an X-Y manner by applying base drive to the proper input (Y) terminal and collector voltage to the corresponding output (X) terminal. In operation, pull-up resistors to B+ can be added to the outputs. For a given input, the output will depend on the pattern to which the P-ROM array was programmed.

According to the invention, there has been provided a cell which requires much less current for programming than prior art devices. This makes for better control of the fusing process with less potential damage to other parts of the integrated circuit. The invention also makes possible the use of smaller leads to the programmable cell as well as requiring smaller programming current.

What is claimed is:

1. A permanently alterable semiconductor cell comprising at least a transistor and a fusible elements, the fusible element being coupled in series with an element of said transistor for being fused by a predetermined current through said transistor, said predetermined current being substantially greater than the normal operating current of said transistor, the fusible element being positioned for receiving thermal energy from a junction region of said transistor whereby the predetermined current required for fusing the element is substantially reduced due to said thermal energy.

2. A permanently alterable semiconductor cell according to claim 1 wherein the fusible element forms a portion of the emitter lead of said transistor.

3. A permanently alterable semiconductor cell according to claim 1 wherein the fusible element forms a portion of the collector lead of said transistor.

4. A permanently alterable semiconductor cell according to claim 1 wherein the transistor lead is a deposited aluminum layer and the fusible element comprises a narrowed portion of said layer.

5. A permanently alterable semiconductor cell according to claim 1 wherein said junction region of the transistor comprises the collector-base junction.

6. An integrated circuit programmable read only memory comprising:
a plurality of cells interconnected to form an array of rows and columns, each cell containing at least a transistor and a fusible element, said fusible element coupled in series with an element of said transistor for being fused by a predetermined current through said transistor, said predetermined current being substantially greater than the normal operating current of said transistor, the fusible element positioned for receiving thermal energy from a junction region of said transistor, whereby the predetermined current required for fusing the element is substantially reduced due to said thermal energy.

* * * * *